United States Patent [19]
Benham

[11] Patent Number: 6,162,065
[45] Date of Patent: Dec. 19, 2000

[54] BUTTON AND DOVETAIL CONNECTOR ACTUATION MECHANISM

[75] Inventor: John E. Benham, Torrington, Conn.

[73] Assignee: FlexConn, Inc., Wallingford, Conn.

[21] Appl. No.: 09/202,049

[22] PCT Filed: Jun. 26, 1997

[86] PCT No.: PCT/US97/11101

§ 371 Date: Dec. 7, 1998

§ 102(e) Date: Dec. 7, 1998

[87] PCT Pub. No.: WO98/00884

PCT Pub. Date: Jan. 8, 1998

Related U.S. Application Data

[60] Provisional application No. 60/020,888, Jun. 28, 1996.

[51] Int. Cl.[7] .................................................. H01R 12/00
[52] U.S. Cl. .............................. 439/67; 439/493; 439/545
[58] Field of Search ............................... 439/67, 493, 329, 439/545

[56] References Cited

U.S. PATENT DOCUMENTS

| | | | |
|---|---|---|---|
| 3,129,990 | 4/1964 | Rice et al. | 439/74 |
| 3,526,869 | 9/1970 | Conrad et al. | 439/260 |
| 3,897,991 | 8/1975 | Pritulsky | 439/260 |
| 4,480,884 | 11/1984 | Babuka et al. | 439/59 |
| 4,583,800 | 4/1986 | Roberts et al. | 439/493 |
| 4,636,019 | 1/1987 | Gillett et al. | 439/62 |
| 4,669,795 | 6/1987 | Bonhomme et al. | 439/267 |
| 4,850,883 | 7/1989 | Kabadi | 439/67 |
| 4,892,487 | 1/1990 | Dranchak et al. | 439/260 |
| 4,909,752 | 3/1990 | Hallum et al. | 439/325 |
| 4,948,374 | 8/1990 | Carter | 439/67 |
| 5,145,381 | 9/1992 | Volz | 439/62 |
| 5,160,269 | 11/1992 | Fox, Jr et al. | 439/67 |
| 5,171,154 | 12/1992 | Casciotti et al. | 439/67 |
| 5,228,863 | 7/1993 | Campbell et al. | 439/67 |
| 5,402,316 | 3/1995 | Volz et al. | 361/785 |
| 5,704,793 | 1/1998 | Stokoe et al. | 439/62 |
| 5,707,241 | 1/1998 | Hamlin et al. | 439/67 |

FOREIGN PATENT DOCUMENTS 2178252  7/1986  United Kingdom ............. H01R 4/52

OTHER PUBLICATIONS

European Search Report—Aug. 2, 1999—2 pages.

*Primary Examiner*—T. C. Patel
*Attorney, Agent, or Firm*—Alix, Yale & Ristas, LLP

[57] ABSTRACT

A connector for joining a printed circuit board (202) having an army of contact pads (204) to a connector (200) incorporating flexibe circuits (210) with mating contact pads (212), by means of a button and dovetail type interaction between the board and connector. A post (206) projects from the surface of the board. Each post has an enlarged head so that the post resembles a button. The head, when mated with a slot (220) on the connector, achieves a camming action resulting in a predetermined normal force versus insertin position relationship. A compliant member (224), preferably a fluid filled bladder, is supported by a beam member (208) and interposed between the beam member and the array of flexible circuit contact pads. A dovetail slot provided in the beam member is shaped to receive the corresponding post and has a precisely shaped cam race surface which engages the head of post. Such arrangement urges the contact pads on flexible circuit against the mating contact pads on the printed circuit board.

20 Claims, 8 Drawing Sheets

BUTTON AND DOVETAIL CONNECTOR ACTUATION MECHANISM

CROSS-REFERENCE TO RELATED APPLICATIONS

This is the national stage of International Application No. PCT/US97/11101 filed Jun. 26, 1997, and the regular application under 35 U.S.C. § 119(e) of provisional application No. 60/020,888 filed Jun. 28, 1996. This application claim benefit to provisional application 60.020,888 filed Jun. 28, 1996.

BACKGROUND OF THE INVENTION

The present invention relates to connectors for electrical conductors, and more particularly, to connectors for joining high density conductors such as found on printed circuit boards, with corresponding contacts on flexible circuits.

As the size and/or complexity of circuit components and their associated printed or etched circuit conductors continue to be miniaturized, the size of the contacts for interconnecting components has also decreased. Conventional spring biased connectors can no longer be effectively used under these circumstances. U.S. Pat. No. 4,968,265, issued Nov. 6, 1990 for "Fluidly Actuated Electrical Connector", and U.S. Pat. No. 5,002,496, issued Mar. 26, 1991 for "Cam Actuated Electrical Connector", represent significant improvements to earlier connectors, by establishing and maintaining electrical contact between conductive members to be joined, without inherent minimum line and space limitations that depend upon the spring characteristics of the mating contact structures. These patents describe the implementation of so-called "hydrostatic connector" techniques, which utilize a fluid bladder interacting between a backing member and the conductors, whereby the bladder forms a compliant membrane surface that transmits force uniformly from the backing member to the flexible circuit, forcing contact pads on the flex circuit to mating pads on the PCB such that a high integrity electrical connection is realized. The disclosures of these two patents are hereby incorporated by reference.

Although the various embodiments described in the patents mentioned immediately above, can perform satisfactorily, the actuation mechanisms are not well integrated with the connector, resulting in a significant increase in manufacturing costs, as well as occupying space which could otherwise be utilized for further miniaturization and compacting of components.

Some efforts have been made to improve these deficiencies, as represented by the Hydro Flex™ connector system from Synapse Technologies, Inc. This system is made up of two functional parts, a controlled-impedance flex circuit with ground-plane, gold contact pads, and a molded beam force generator containing a sealed, fluid-filled bladder. When actuated, the beam is deflected and the bladder forces pads on the flex circuit against mating pads on e.g., a PCB, providing uniform normal force and virtually zero shear force. This connector system is tolerant of variations in board thickness and flatness, and maintains a gas tight seal over a wide temperature range. Contact densities of up to 100 per inch are achieved on a single sided stacking configuration, and up to 200 per inch in a double sided right angle version. Although the actuation scheme in the Hydro Flex™ connector was simplified relative to that disclosed in the two patents identified above, the technique for actuating the beam to energize the bladder against the pads on the flex circuit and against pads on the PCB, did not allow contact pad wipe.

SUMMARY OF THE INVENTION

Accordingly, it is an object of the present invention to provide apparatus and method for actuating a hydrostatic connector in the field, which wipes the contact pads while eliminating the negative impact of contamination and/or oxidation, and allows establishment of high quality, low resistance electrical connections.

It is another object of the invention, to provide a connector system, wherein a predetermined normal force between conductors to be mated is achieved as a result of a predetermined force versus position relationship generated as the connector and, for example a printed circuit board, are moved toward each other.

It is yet another object of the invention to provide a connector system, whereby such a pre-established normal force versus position relationship can be achieved, independent of the thickness of the printed circuit board or the like, to which the connector is joined.

It is yet a further object of the invention, to provide a connector construction, wherein a pre-curvature in the shape of the connector, overcomes certain anomalies that have been observed in known connectors.

Additionally, the invention achieves the primary objectives with a very simple mechanism made up of components which are readily manufactured and inexpensive, while retaining all of the previously demonstrated benefits of hydrostatic connector technology.

These objects are achieved by providing a connector actuation mechanism for joining a circuit-carrying substrate such as a printed circuit board having an array of contact pads on one or both surfaces, to a connector incorporating one or more conductor leads, such as flexible circuits with mating arrays of contact pads, by means of a button and dovetail type interaction between the board and connector. A post rigidly projects from the surface of the board on either end of the board contact pad array. Each post has an enlarged head, so that the post resembles a button. The head has a predetermined geometry which, when mated with a dovetail-like slot on the connector, achieves a camming action resulting in a predetermined normal force versus insertion position relationship. The connector carries a beam assembly which includes a beam member extending transversely behind the array of flex circuit contact pads. A compliant member, preferably a fluid filled bladder, is supported by the beam member and interposed between the beam member and the array of flexible circuit contact pads to provide force distribution and equalization for the array of contact pads. A dovetail slot is provided in the beam member on either end of the flexible circuit contact pad array. Each slot is shaped to receive a corresponding post. The slot has a precisely shaped cam race surface which engages the head of the post. Such engagement at each end of the beam member, pulls the ends of the beam toward the printed circuit board, at a controlled rate, which urges the contact pads on the flexible circuit against the mating contact pads on the printed circuit board. The slots and posts are located such that they achieve and maintain alignment between the pads on the flexible circuits and the mating pads on the printed circuit board.

Preferably, the predetermined force versus position relationship increases to a relative maximum force as the connector is engaged, and decreases to a lesser value at the fully engaged position, thereby achieving positive retention of the connector in the engaged position. The connector actuation is independent of the thickness of the printed circuit board, and is defined solely by the relative positions of the post heads and mating slots in the beam assembly.

In a particularly noteworthy feature, which can be implemented independently of the button and dovetail type actuation, the beam member is molded with an inherent curvature, such that the bladder retained in the beam, has a convex curvature relative to the PCB, at initiation of the actuation. Upon completion of actuation, the beam and associated bladder are flat. The precurve in the beam according to this feature, allows maintenance of a constant separation of the beam from the back of the flexible circuit, minimizing deformation of the bladder which can arise due to temperature cycling and other environmental effects, after the connectors have been in service for some time.

In method form, the invention is implemented by joining a printed circuit board or the like having an array of conductors to a connector having a flex circuit or the like with a corresponding array of conductors, by providing at least two posts each having a cam profile, on one of the board or connector, and providing a respective two slots each defining a cam race, on the other of the board or connector. The posts and slots are advanced toward each other such that upon partial engagement between the posts and slots, the conductors on the board contact respective conductors on the connector. Upon continuing advance of the posts and slots toward each other, the cam profile on each post interacts with the cam race on a respective slot to produce a predetermined normal contact force versus advancing position relationship between the conductors in contact, whereby at a fully engaged position of the posts and slots the normal contact force is sufficient to enable signal transmission through all conductors in contact, with negligible deterioration.

BRIEF DESCRIPTION OF THE DRAWINGS

The preferred embodiments will be described below with reference to the accompanying drawings, in which.

DESCRIPTION OF THE PREFERRED EMBODIMENTS

Figure 1:
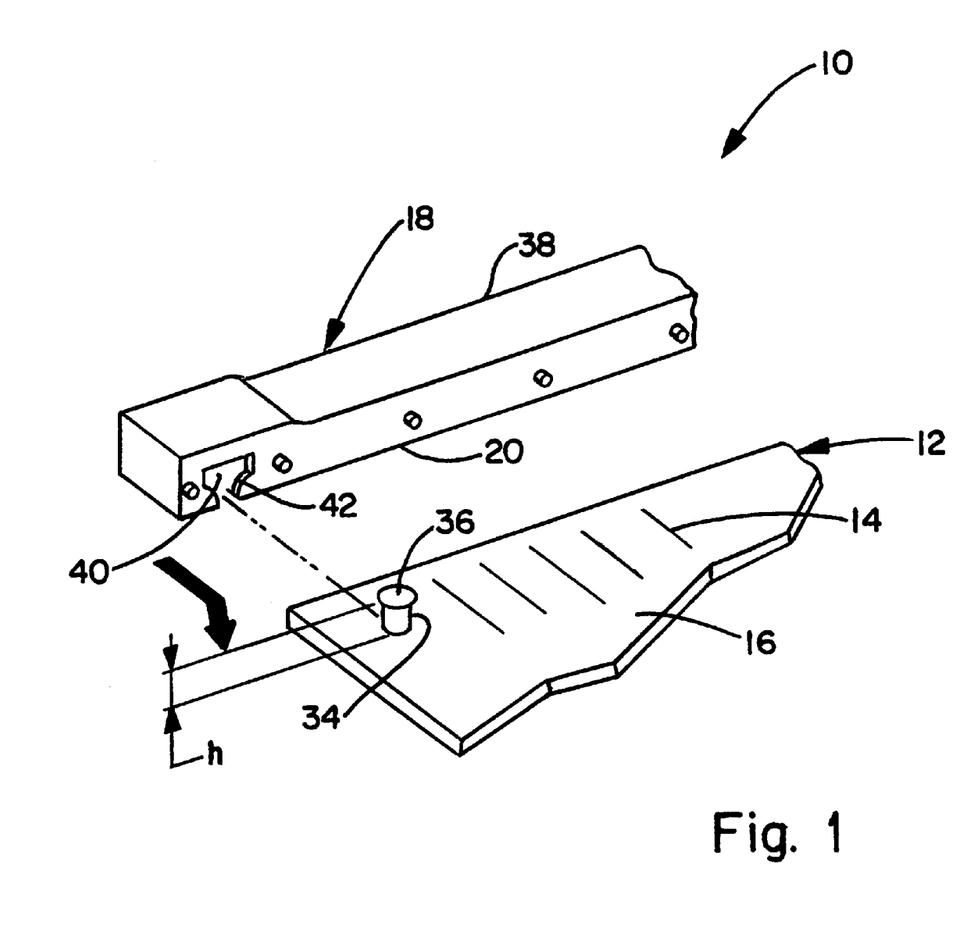
FIG. 1 is a schematic representation of a printed circuit board having a post, and a connector having a slot, to illustrate the basis of the present invention.

FIG. 1 shows a connection 10 about to be made, between a printed circuit board (PCB) 12, which has an array of conductor leads 14 on one surface 16, and a portion of a connector 18 adapted to support a corresponding array of flex circuit conductors (which in the illustrated embodiment would be on the underside 20, and therefore are not visible). The connector can optionally be supported directly or indirectly by a chassis (not shown) in an electronic system such as a computer, process control system, or the like.

Figure 2A:
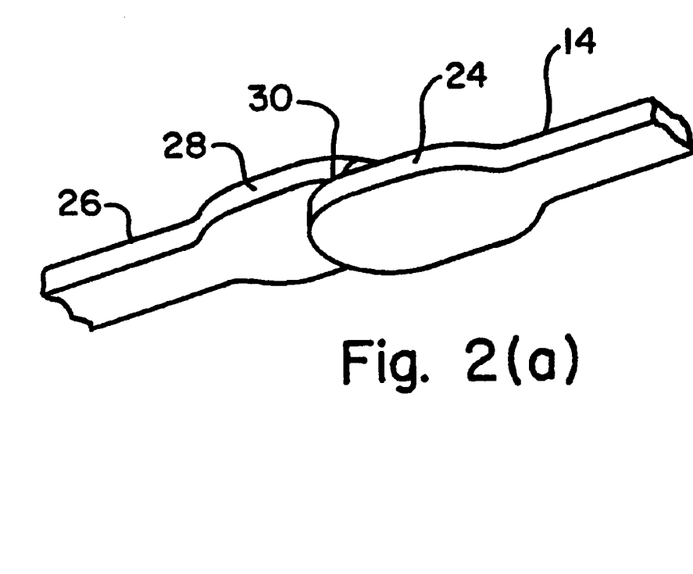
FIGS. 2(a) and 2(b) represent opposed electrical contact pads during initiation and completion of the actuation of the connector according to the invention.
Figure 2B:
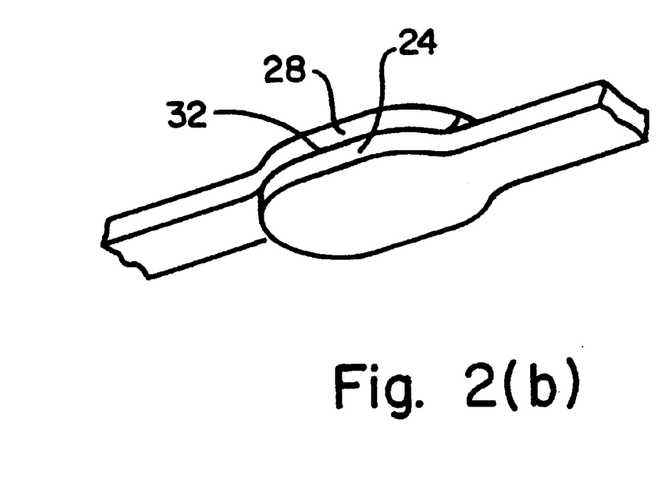

FIGS. 2(a) and 2(b) illustrate in a detailed enlargement, the manner in which the conductor leads 14 from the PCB, are to mate with corresponding flex circuit conductors 26 on the connector, as the PCB 12 is joined to the connector 18, in a manner to be more fully described below. The conductors 14 terminate in contact pads 24 and the conductors 26 likewise terminate in contact pads 28. At initialization of the makeup of the connection, represented in FIG. 2(a), the pads 24, 28 would ideally overlap with a slight spacing between them at 30. This is not absolutely necessary, in that the overlap could be achieved with a very low force, so long as the pads 24,28 do not abut end-to-end. Upon completion of the makeup of the connection, as represented in FIG. 2(b), the pads 24,28 are fully overlapped at 32, and there is established a normal force between the pads sufficient to ensure negligible deterioration of the signals to be transmitted through the pads, during operation of the equipment in which the connection has been made. A wiping action between pads is achieved as a result of the actuating sequence described below.

Figure 3A:
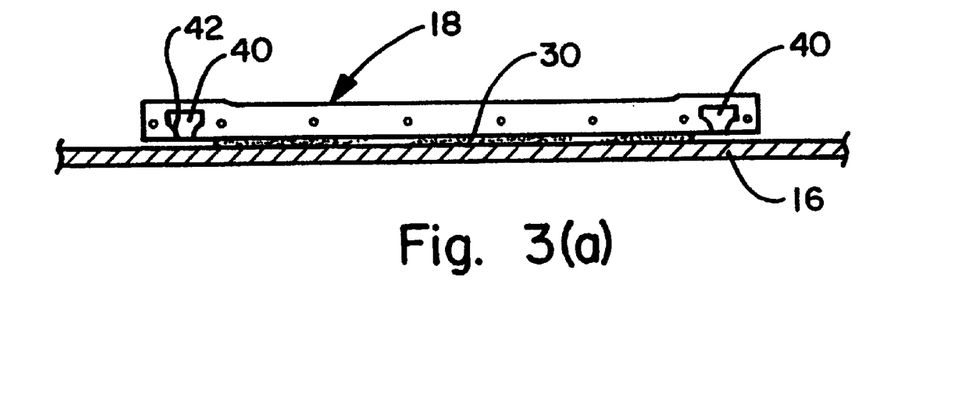
FIGS. 3(a) and 3(b) represent different stages during the actuation of the connector according to the invention.
Figure 3B:
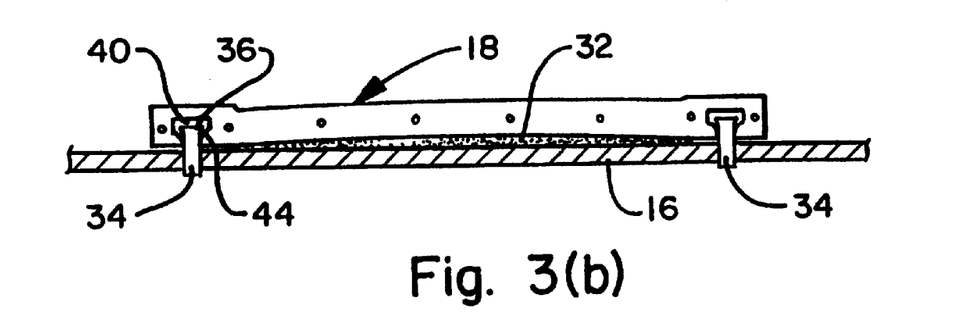

With reference now to FIGS. 1–3, a rigid post 34 projects from surface 16 of the board 12, on either side of the array 14, to mate with the corresponding slots 40 in the beam 38 which is part of the connector 18.

Each post 34 includes an enlarged head 36. The slot 40 in the beam member on either side of the array of flex circuit conductors on the underside 20, are shaped to receive the corresponding posts 34 along a direction transverse to the beam member 38. Each slot has a rigid cam race 42, for engaging a cam profile 44 on the head of the post. As the board 12 is moved toward the connector 18, the posts 34 enter respective slots 40 and the cam profiles 44 on the heads follow predetermined paths along the cam races 42, thereby pulling the ends of the beam, where the slots are located, downwardly In the direction of the PCB at a controlled rate dictated by the relationship between the cam profile 44 and cam race 42. In FIG. 3(a), the initial contact of the pads according to FIG. 2(a) is represented at 30, and the completion of the actuation is represented in FIG. 3(b), whereby the pads are fully overlapped with the desired normal force therebetween, according to FIG. 2(b).

Figure 4:
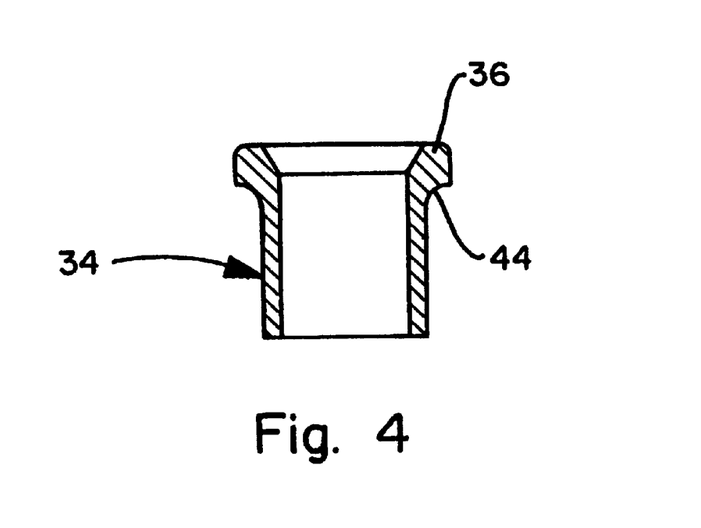
FIG. 4 is a longitudinal section view of a post suitable for use with the present invention.

It can be appreciated from FIG. 1, that the extent to which the connector 18 and board 12 are drawn closer together, depends on the relationship between the force exerted between the cam profile 44 and cam race 42, versus insertion position of the post 34 in the slot 40. Whereas the connector 18 including beam 38, slot 40 and cam race 42 can be manufactured with a high degree of care and uniformity, particularly if they are manufactured under the authority of a single source, such a high degree of dimensional control cannot be expected with regard to the thickness of the PCB 12, with can typically vary plus or minus 10%. The variation on the PCB thickness does not, however, present a concern with the present invention, because the height and shape of the post 34, relative to the surface 16 of the PCB 12, can be specified and controlled with a much higher degree of accuracy. In other words, the profile of the post 34, as shown in FIG. 4, can be easily controlled with respect to the height dimension shown in FIG. 1, relative to the PCB surface 16. The surface 16 serves as a datum unique to each PCB, regardless of the PCB thickness. In particular, it can be seen in FIG. 4 that the head 36 has a substantially frustoconical underside defining the cam profile 44. By "frustoconical" in this context, is meant obliquely outward from the vertical. The cam profile 44 when viewed as in FIG. 4, need not be straight, but can be radiused with one or more centers of curvature.

Figure 5:
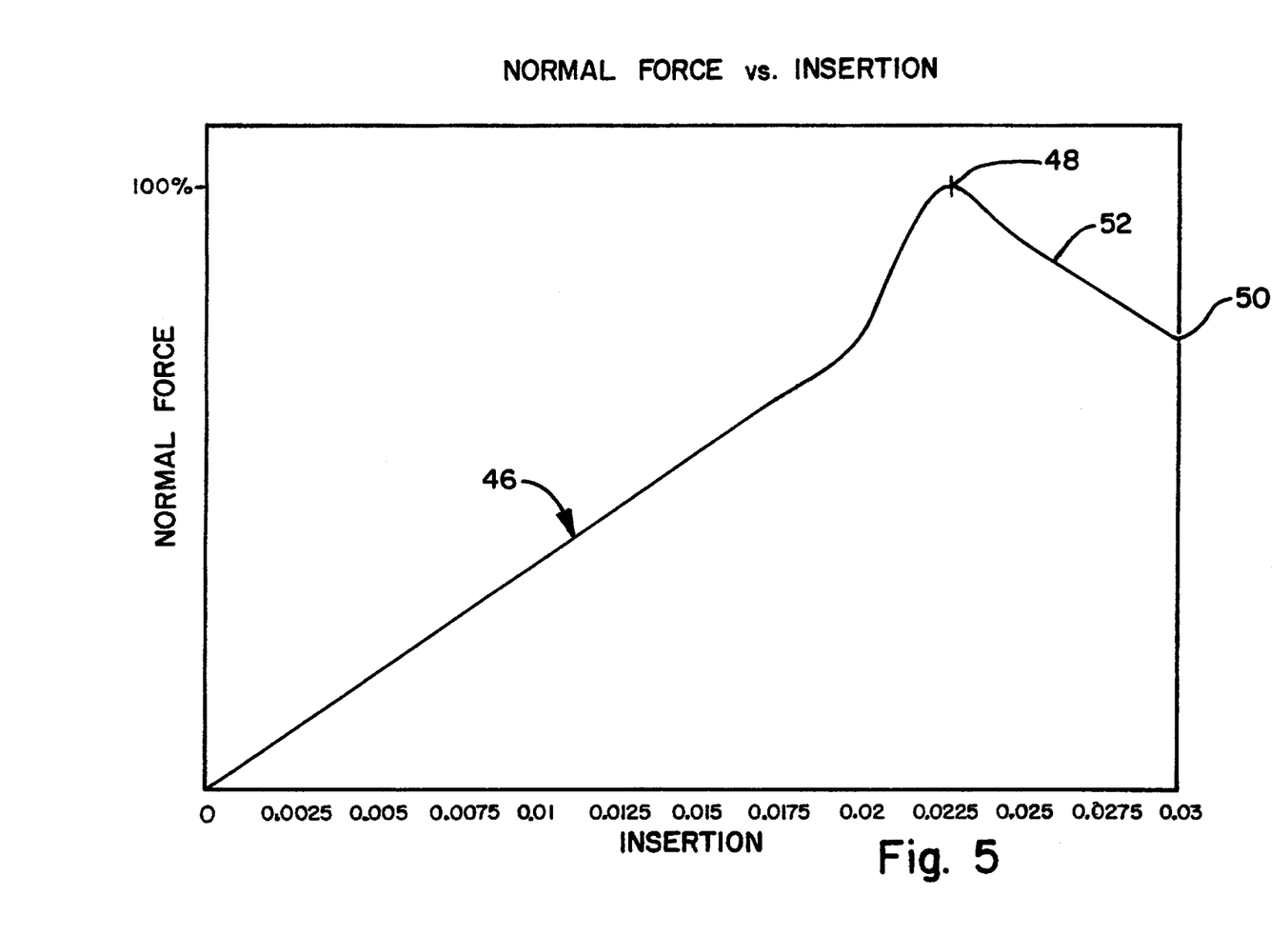
FIG. 5 is a graph showing a representative relationship of the normal force per contact pad, versus insertion distance of the post into the slot along cooperating cam surfaces, in accordance with the invention.
Figure 6:
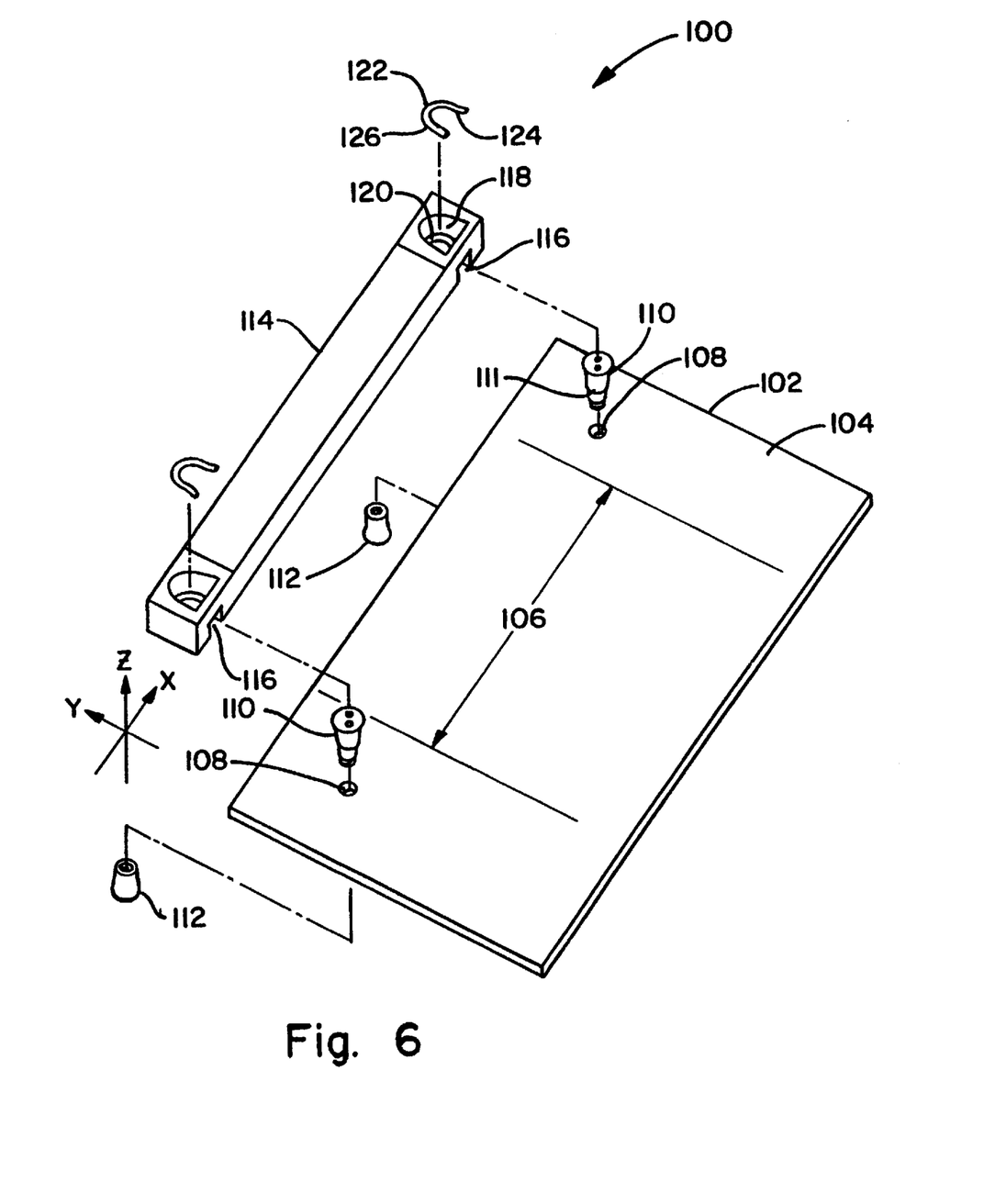
FIG. 6 is a schematic view, similar to FIG. 1, showing additional details of one implementation of a suitable slot configuration for use with the present invention.

The Interaction of the cam profile 44 with the cam race 42 as described above, permits the design of a connector system which can be further specified and controlled as shown in FIGS. 5 and 6. FIG. 5 shows a curve of the normal force per contact pair (i.e., as shown in FIG. 2(b)), versus the insertion distance of the cam profile 44 along the cam race 42, as represented in FIGS. 1 and 3. As an example, but by no means limiting in its implementation of the present invention, if the displacement between the position shown in FIG. 2(a) and 2(b) is 0.03 inch, the desired normal force along that insertion distance is represented by curve 46. This curve is substantially linear during approximately 60% of the insertion travel, then rises to a maximum at 48, before decreasing to the full insertion position at 50. The curve portion between 48 and 50, monotonically decreases. The illustrated shape of the normal force versus insertion relationship, results from the desirable property that if the user manually moves the PCB into the connector through the insertion distance, the head "snaps" at the maximum 48 to define the final position 50, and is retained there unless a positive retraction force is applied in the reverse direction up portion 52 of the curve.

The characteristics of curve 46 for which a particular connector system will be designed, depend on for example, the material of the contact pads, the pad geometry, the uniformity of the contact pads, and the like.

This degree of control on the normal force versus insertion, depends not only on the design and care in the fabrication of the cam profile 44 on the post, but also on the ease with which the cam race 42 can be provided in the beam. FIG. 6 shows a variation 100 of an arrangement that generally resembles that shown in FIG. 1. The PCB 102 has an upper surface 104 on which an array of leads with contact pads spans the region generally indicated at 106. For convenience, a directional reference coordinate system is shown at the left of FIG. 6. The leading edge of the PCB 102 is parallel to axis X, the PCB is moved in direction Y to make up the connection, and as the connection is made, the surface 104 and the connector beam 114, move toward each other along axis Z. Each conductor lead in array 106 typically extends along direction Y, as do the flex circuit conductors beneath beam 114. The beam 114 extends along direction X, transversely behind the array of flex circuit conductors, The connection according to the invention can be made manually, without the aid of a tool. Alternatively, the connector could be actuated in an electrical system chassis having mechanical assist of a type similar to what is conventionally available.

In the embodiment of FIG. 6, the POB 102 has through holes 108 on either side of the array 106, for receiving respective dual post members 110,112, which interconnect through the holes 108, for example, by threading or riveting. This connection is completed when the rim or shoulder 111 contacts the corresponding surface 104 of the PCB, thereby establishing the datum for the distance of the cam profile on the head, relative to the surface 104 of the PCB. Such a shoulder can also be provided on the opposed post component 112, whereby a similar datum is established for the projection of post portion 112 from the other side of the PCB 112.

The slots 116 at each longitudinal end of the beam 114, extend in the Y direction, and in the illustrated embodiment, intersect with a cut out 118 extending downwardly along the Z direction. The cut out has an internal ledge 120, which is substantially U-shaped at a predetermined distance along the Z direction, from the undersurface of the beam 114 that carries the flex circuit conductors. A carefully fabricated clip 122 is dropped through cut out 118 onto, for support by, ledge 120. The clip 122 is preferably metal and generally U shaped, with the open portion 124 situated to receive the head of post 110. The upper surface 126 of the clip 122 defines the cam race, and also has a substantially U-shape. The cam race could, alternatively, be integrally molded as part of the ledge 120.

This "U"-shape converges along the direction from the open to the closed end (i.e., long direction Y), such that the contact between the cam race surface 126 and the cam profile 44 (as shown in FIG. 4) moves closer to the cylindrical stem of the post 34, as the post moves in the insertion direction Y. This also moves the beam downwardly in the Z direction, relative to the datum surface 104 of the PCB. The clip 122 can diverge slightly as the legs approach the closed end, to provide the snap in and retention property represented at portions 48, 50 and 52 of FIG. 5.

Those of ordinary skill in the field of fabricating precision fixturing and the like, can, from the present description, implement the suitable variations of the "button and dove tail" actuation scheme described herein, to meet the specific requirements of end users. Accordingly, the form and shape of the cam profile and cam race described herein, should not be understood as limiting the scope of the meaning of those terms in the appended claims.

Figure 7:
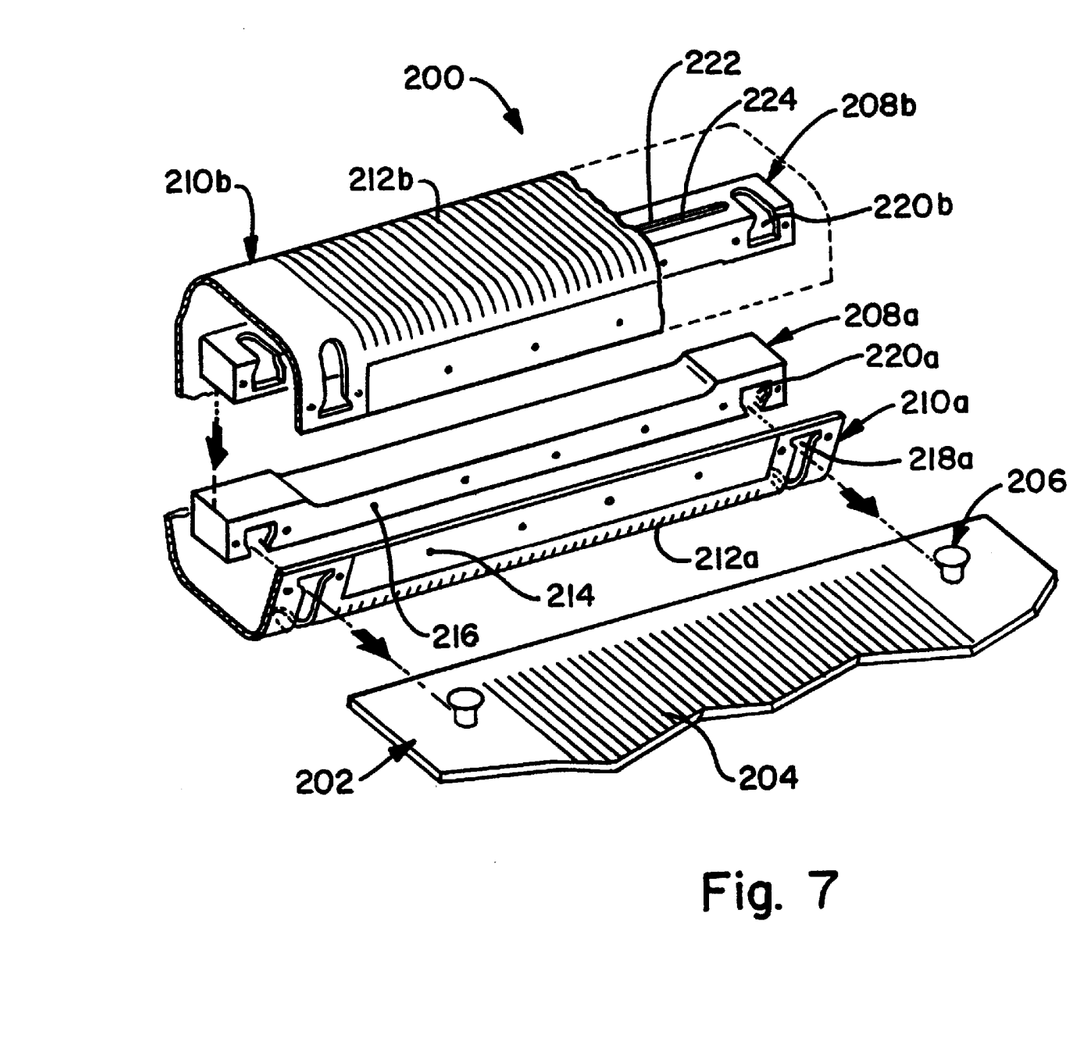
FIG. 7 is an exploded view of one implementation of the invention, by which two printed PCBs can be connected to a respective two connectors, in close parallel relation.
Figure 8:
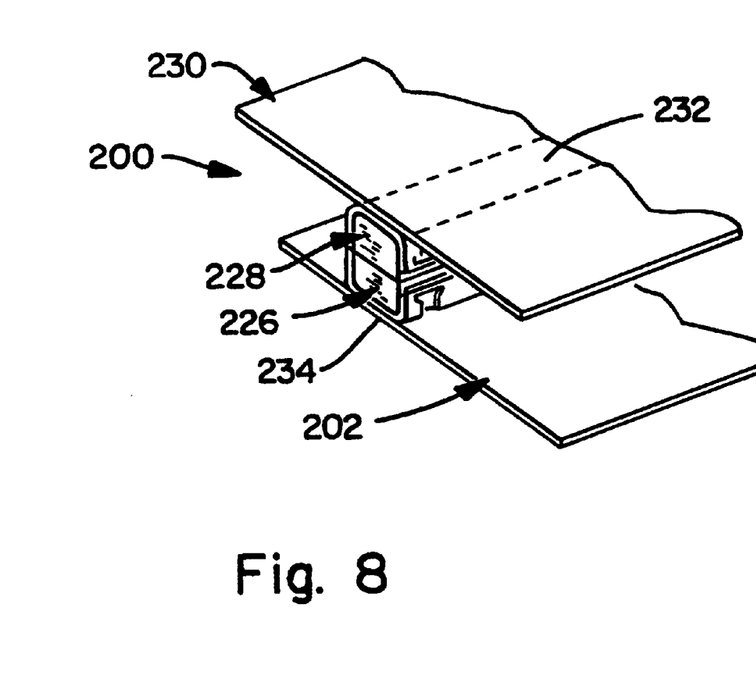
FIG. 8 shows the completed connection corresponding to the exploded view of FIG. 7.

FIGS. 7 and 8 illustrate in greater detail, a practical implementation of the present invention using the principles described above. The connection 200 is made in the first instance, between the PCB 202 having the conductor array 204, by the engagement of the spaced apart posts 206 with the connector beam 208a. In this embodiment, two connectors 226, 228 are stacked back-to-back, for receiving two PCB's 202, 230 in parallel, spaced relation. The connector beam 208a has a flex circuit 210a secured thereto, such that the array 212a of conductors and associated contact pads, are situated on the underside of the beam 208a. The lateral or border portions of the flex circuit 210a, have cut-outs 218a which align with the slots 220a on the beam. Alignment holes 214 on the flex circuit 210 can engage corresponding alignment pins 216 on the beam, to assure correct positioning of the conductor pads in array 212a, relative to the slots 220a and likewise to assure registry with the pads on array 204 when the posts 206 on board PCB 202 are fully engaged in the slots 220a.

Similarly, beam 208b has another portion 212b of the flex circuit 210b wrapped and secured thereto, for alignment and mating with the pads on the underside of PCB 230. With respect to both beams 208a and 208b, the rigid beam member extends transversely behind the array 212a, 212b, of the flex circuit conductors. A constant volume, fluid filled bladder 224 is supported by the beam 208b (but a corresponding bladder is not visible in 208a), preferably in a substantially square channel extending longitudinally in the beam member. The bladder provides force distribution and equalization for the array of contact pads. Upon full actuation of the connector to the condition represented in FIG. 3(b), a uniform normal force is imposed on every pair of mating contact pads, due to the hydrostatic pressure transmitting effect of the bladder. Although a constant volume fluid-filled bladder is preferred, the present invention can still be advantageously implemented with any compliant member, e.g., a strip of rubber.

With particular reference to FIG. 8, it can be appreciated that, preferably, a stabilizing beam with associated bladder, is actuated by a button and dove tail connection of the present invention, via engaging posts (not shown) projecting from the top surface of card 230. This connected beam would traverse the top of card 230, between the phantom lines indicated at 232. Similarly, another stabilizing beam with associated bladder would engage with posts projecting from the underside of PCB 202, as indicated at 234, parallel with the lines indicated at 232. Each stabilizing beam and bladder can be identical in structure to 208b. In general, it is preferred that, wherever a beam with associated flexible circuit, is urged against a conductor array on the surface of a PCB, a backing or stabilizing beam with bladder also be secured on the back side of the card, to produce a force against the back side of the card, in opposition to the force imposed on the side of the card having the array, by the other beam.

Figure 9:
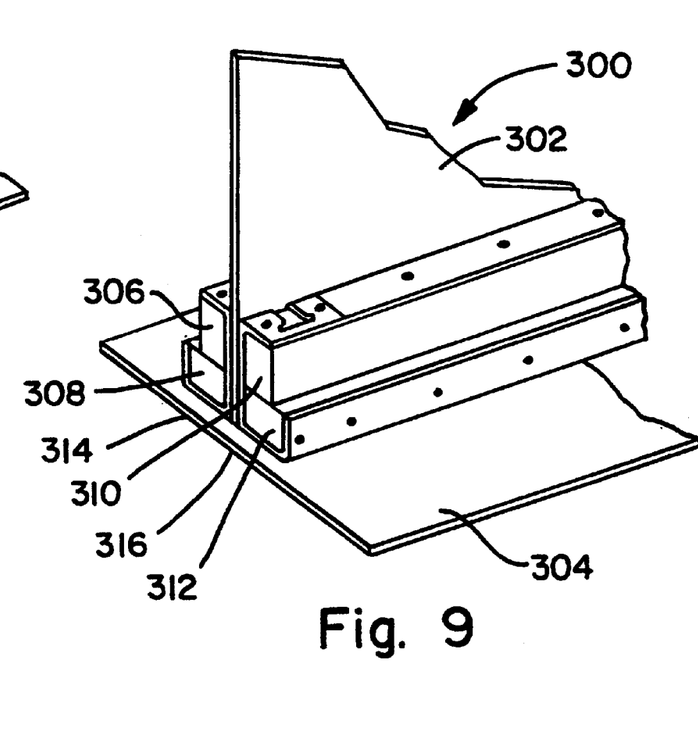
FIG. 9 shows an alternative connection, by which two PCBs are mated with corresponding connectors at right angles to each other.

FIG. 9 represents another embodiment 300, wherein a PCB 302 is mated via connectors 306, 310, in a compact configuration adjacent to the mating of another PCB 304 perpendicularly to PCB 302, which is effectuated by connectors 308, 312. In this embodiment, the connectors 306, 310 exert normal forces on opposite sides of the card 302, in opposition to each other, and thereby provide the desired balance. The connectors 308, 312 both exert normal forces to the visible side of card 304 and therefore, it is preferred that counter balancing stabilizing beams with bladder be attached to the underside of PCB 304, at 314 and 316.

Figure 10A:
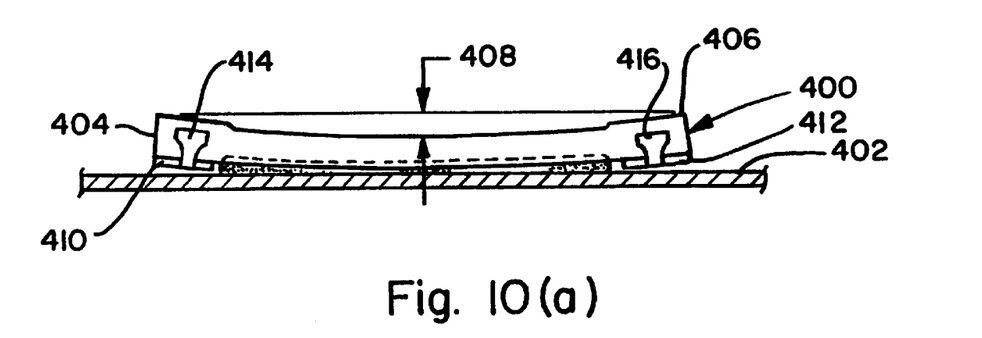
FIGS. 10(a) and 10(b) schematically show another inventive feature by which the beam which carries the bladder and has the slots at either end, is formed with a precurve which straightens during actuation.

As discussed above, the hydrostatic nature of the normal forces applied to the mating pads, resulting from actuation as represented in FIG. 3(a) and (b), assures a uniform force on each pair of contact pads. Upon observing inexplicable evidence of non-uniformity of contact pressure after periods of extended use, a further improvement was made which has eliminated this anomaly. As shown in FIG. 10, if the rigid molded beam 400 is preformed with a curvature which is convex along the bladder 420 (i.e., convex relative to the surface of a PCB 402 with which it will mate), the uniformity of contact pad force does not deteriorate under any circumstances presently known to the inventors. As a result of the curvature, each longitudinal end 404, 406 of the beam is raised relative to the surface of the PCB, before actuation. The desired curvature can be quite small, i.e., on the order of 0.005 inch deviation in a beam having a length of a few inches, as indicated at 408. It may be desirable to include pedestals 410, 412 at each lateral end 404, 406 of the beam, substantially under the respective slots 414, 416.

Figure 10B:
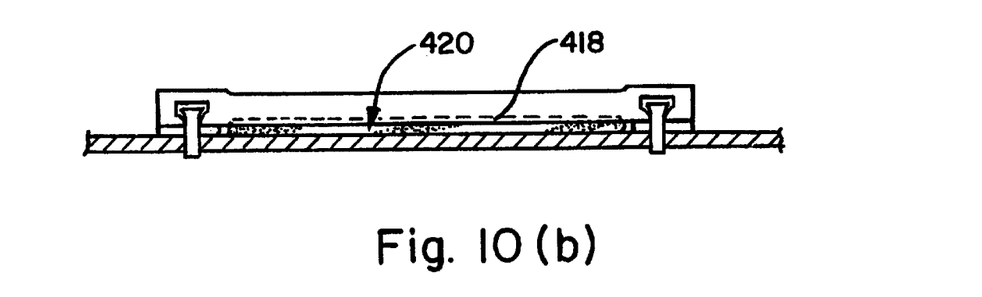

Upon actuation as represented in FIG. 10(b), the beam will be relatively straight, as will the channel 418 and bladder 420 supported by the beam. The fact that in the actuated condition, the beam is straight, as shown in FIG. 10(b), rather than slightly concave relative to the PCB, shown in FIG. 3(b), is believed to prevent localized extrusion of bladder wall material or other anomalies that were observed after extended use of the equipment in which the connection was made.

What is claimed is:

1. A connector arrangement for joining a printed circuit board having an array of conductors spaced in a lateral direction on one surface, to a connector having a flex circuit with a corresponding array of conductors spaced in said lateral direction, comprising:

a printed circuit board including a post rigidly projecting from said one surface of the board on each lateral side of the board conductor array, each post including an enlarged head having a cam profile;

a connector beam assembly including,
a rigid beam member situated behind the flex circuit and extending along the lateral spacing direction of the conductors,
a compliant member directly supported by the beam member and interposed between the beam member and the flex circuit to provide compliant support for the array of flex circuit conductors,
a slot in the beam member on each lateral side of the array of flex circuit conductors, shaped to receive a corresponding post, said slot having a rigid cam race for engaging the cam profile on the head of the post, whereby as the board is moved toward the connector, each post enters a respective slot and the cam profile on each head follows a predetermined path long a cam race, thereby urging the board array and the connector array into contact with each other.

2. The connector arrangement of claim 1, herein each predetermined path includes a respective stop position which retains the post in the slot to maintain a predetermined contact force between each of said board conductors and a corresponding flex circuit conductor.

3. The connector arrangement of claim 1, wherein
each head has a substantially frustoconical underside defining said cam profile, and
each cam race has a substantially "U" shape which is open to receive said head, and converges along said predetermined path.

4. The connector arrangement of claim 1, wherein the compliant member is an elongated fluid-filled bladder extending in said lateral spacing direction and wherein each slot is shaped to receive a corresponding post along a direction transverse to the bladder.

5. The connector arrangement of claim 1, wherein each slot is defined by a recess in the beam member and a distinct clip member supported in the recess, said clip defining said cam race.

6. The connector arrangement of claim 5, wherein the cam profile on the head of the post is defined by a substantially frustoconical underside of the head.

7. The connector arrangement of claim 6, wherein the compliant member is an elongated fluid-filled bladder extending in said lateral spacing direction and wherein the slot is shaped to receive a corresponding post along a direction transverse to the bladder.

8. The connector arrangement of claim 3, wherein the board has a leading edge and the slot is shaped to receive a corresponding post along a direction perpendicular to said leading edge.

9. The connector arrangement of claim 1, wherein
the board has an opposite surface to said one surface, the opposite surface having spaced apart posts projecting therefrom, and
a stabilizing beam assembly is situated on said opposite surface, and includes a beam member supporting a compliant member, and slots which engage said spaced apart posts on said opposite surface, for producing a force against said opposite surface of the board in opposition to the force which urges the conductor array on said connector toward the board array on said one side of the board.

10. The connector arrangement of claim 9, wherein each beam member has a curvature which is convex along the respective compliant member prior to actuation, but is flat after engagement of the posts with the slots.

11. A connector actuation mechanism joining a printed circuit board having an array of contact pads on a surface to a connector incorporating one or more flexible circuits with a mating array of contact pads, comprising:

spaced apart posts rigidly projecting from said surface of the board, each post including an enlarged head with a predefined geometry;

a connector beam assembly including,
  a beam member extending behind the arty of flex circuit contact pads,
  a compliant member supported by the beam member and interposed between the beam member and the array of flexible circuit contact pads,
  spaced apart slots in the beam member, each slot shaded to receive a corresponding post along a post insertion direction and having a predefined cam race surface for engaging the head of said corresponding post;

whereby as the connector is moved toward full engagement of the slots onto the posts the connector is pulled toward the printed circuit board according to a predefined pulldown force versus post insertion position relationship, which urges the contact pads on the flexible circuit against the mating contact pads on the printed circuit board.

12. The connector actuation mechanism of claim 1, wherein the slots and the posts are located such that they achieve and maintain alignment between the pads on the flexible circuits and the mating pads on the printed circuit board.

13. The connector actuation mechanism of claim 11, wherein the predetermined force versus position relationship goes through a maximum pulldown force before the posts and slots are fully engaged, thereby achieving positive retention of the posts in the slots.

14. The connector actuation mechanism of claim 11, wherein the pulldown force versus post position relationship is dependent on the positions of the post heads in the slots, and is independent of the thickness of the printe circuit board.

15. An electrical connector having a flex circuit which defines an array of conductors having contact pads spaced apart in a lateral direction to be mated with a corresponding array of conductors on a circuit board, comprising:

a beam member extending behind the array of flexicircuit conductors in said lateral direction;

a compliant member extending in said lateral direction and directly supported by the beam member, interposed between the beam member and the array of flex circuit conductors to provide compliant sup port for the array of flex circuit conductors;

a slot in the beam member on each lateral side of the array of flee conductors, said slot having a rigid cam race for engaging a cam profile carried by a circuit board to be joined to the connector;

wherein the beam member has a curvature which is convex along said compliant member.

16. The electrical connector of claim 15, wherein each slot is formed by a cut-out and a distinct clip member supported by the cut-out, said clip defining said cam race.

17. A method for joining a printed circuit board having an array of conductors to a connector having a flex circuit with a corresponding array of conductors, comprising:

providing at least two posts each having a cam profile, on one of the board or connector, and providing a respective two slots each defining a cam race, on the other of the board or connector;

advancing the posts and slots toward each other such that upon partial engagement between the posts and slots, the conductors on the board contact respective conductors on the connector;

continuing to advance the posts and slots toward each other that the cam profile on each post interacts with the cam race on a respective slot to produce a predetermined normal contact force versus advancing position relationship between the conductors in contact, whereby at a fully engaged position of the posts and slots the normal contact force is sufficient to enable signal transmission through all conductors in contact.

18. The method of claim 17, wherein the step of continuing to advance includes producing a normal contact force that wipes the conductors, before the fully engaged position is reached.

19. The method of claim 17, wherein the step of continuing to advance includes advancing to a maximum normal contact force which is higher than the normal contact force at the fully engaged position.

20. The method of claim 17, wherein the step If continuing to advance includes in sequence, producing a normal contact that wipes the conductors, producing a maximum normal contact force, and then advancing to a fully engaged position at which the normal contact force is less than said maximum force.

* * * * *